United States Patent
Tsuji (10) Patent No.: US 6,211,947 B1
(45) Date of Patent: Apr. 3, 2001

(54) ILLUMINANCE DISTRIBUTION MEASURING METHOD, EXPOSING METHOD AND DEVICE MANUFACTURING METHOD

(75) Inventor: Toshihiko Tsuji, Saitama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/212,101

(22) Filed: Dec. 15, 1998

(30) Foreign Application Priority Data

Dec. 15, 1997 (JP) ................................. 9-363543
Dec. 10, 1998 (JP) ................................ 10-351106

(51) Int. Cl.[7] .......................... G03B 27/74; G03B 27/42; H04N 3/22; H04N 3/23
(52) U.S. Cl. ............................ 355/67; 355/53; 355/69; 355/70; 355/77; 348/745; 348/746; 348/747
(58) Field of Search .................................. 355/53, 67, 69, 355/70, 77; 348/745, 746, 747

(56) References Cited

U.S. PATENT DOCUMENTS

| | | | |
|---|---|---|---|
| 4,999,703 | * 3/1991 | Henderson | 358/60 |
| 5,369,450 | * 11/1994 | Haseltine et al. | 348/745 |
| 5,452,019 | * 9/1995 | Fukuda et al. | 348/655 |
| 5,677,754 | * 10/1997 | Makinouchi | 355/53 |
| 5,721,608 | * 2/1998 | Taniguchi | 355/53 |
| 5,898,477 | * 4/1999 | Yoshimura et al. | 355/53 |
| 5,917,581 | * 6/1999 | Suzuki | 355/55 |
| 5,929,977 | * 7/1999 | Ozawa | 355/53 |

* cited by examiner

Primary Examiner—Russell Adams
Assistant Examiner—Khaled Brown
(74) Attorney, Agent, or Firm—Baker Botts L.L.P.

(57) ABSTRACT

A method of measuring an illuminance distribution on a substrate; which is characterized in that the method comprises a step of reciprocatively moving a detecting sensor positioned on a substrate stage along a route during which the detecting sensor is intermittently stopped at a plurality of locations within an exposure region over the substrate, and, after reaching a turning location, moved to return along the route during which the detecting sensor is intermittently stopped again at these locations; in that measurement of illuminance is performed an even number of times at each location; and in that the illuminance distribution in the exposure region over the substrate is determined based not only on a measured value of illuminance obtained at each location during the forward movement of the detecting sensor but also on a measured value of illuminance obtained at each location during the returning movement of the detecting sensor.

16 Claims, 5 Drawing Sheets

ILLUMINANCE DISTRIBUTION MEASURING METHOD, EXPOSING METHOD AND DEVICE MANUFACTURING METHOD

BACKGROUND OF THE INVENTION

This invention relates to an illuminance distribution measuring method and exposing method, which are applicable to an exposure apparatus for performing the exposure of pattern of semiconductor element or liquid crystal display element in the step of photolithography.

In view of the increasing demand for semiconductor element as well as for the reduction of manufacturing cost of semiconductor element in recent years, it is now desired to enhance the throughput of an exposure apparatus to be employed in the manufacture of semiconductor element, etc. According to an exposure apparatus of this kind, a circuit pattern formed on a projection original (hereinafter generically referred to as reticle) such as a reticle and mask is illuminated by a luminous flux from an optical illumination system, and the pattern thus illuminated is then transferred as an image, by making use of a projection type optical system, onto a photosensitive substrate (hereinafter referred to simply as a substrate) such as a glass plate or wafer having thereon a coated layer of photosensitive material such as resist. Under the circumstances, there has been developed a technique to shorten the exposure time by increasing the illuminance at the surface of the substrate, thereby enhancing the throughput of the exposure apparatus.

Figure 8:
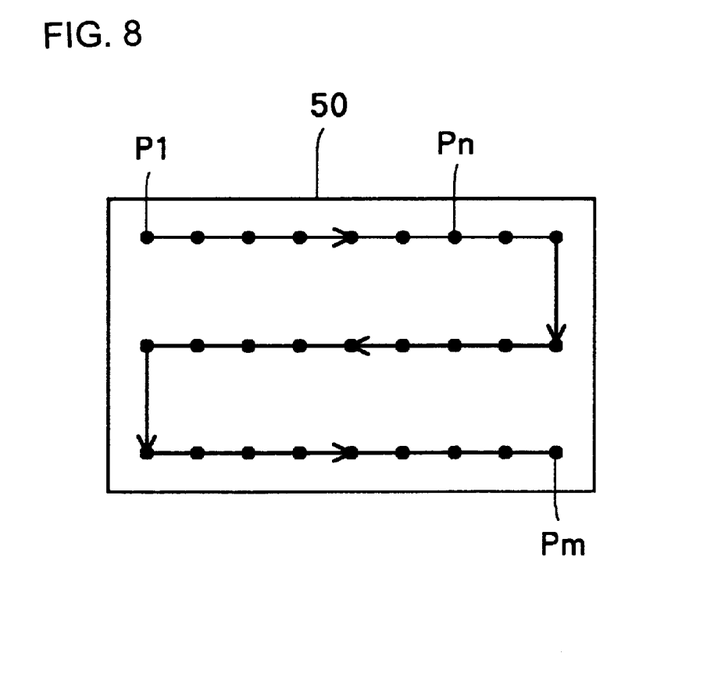
FIG. 8 is a plan view illustrating the order of the movement of a sensor at the occasion of measuring an illuminance irregularity according to the prior art.

Meanwhile, the adjustment in quantity of exposure to the surface of substrate in the exposure apparatus of this kind is performed as follows. Namely, a photoelectric sensor provided with a pin-hole plate to be positioned at the same level as that of the surface of substrate is placed on a substrate stage for mounting the substrate in the vicinity of the location where the substrate is to be positioned. Then, the photoelectric sensor is moved to the irradiation region or exposure region of illuminating light. More specifically, as shown in FIG. 8, the photoelectric sensor is moved step by step from the measurement starting position P1 to the measurement finishing position Pm within the exposure region 50. The measurement of illuminance is performed once at each position starting from the starting position P1 to the finishing position Pm, thereby obtaining the illuminance distribution of the exposure light. Based on the results of measurement, the magnitude of illuminance and irradiation time (in the case of pulse beam, the number of pulse) of the exposure light are controlled, thereby adjusting the quantity of exposure to the surface of substrate.

However, when the illuminance of the exposure light onto the surface of the substrate is increased, the light irradiation energy onto the substrate is increased, thereby inviting a rise in temperature of the photoelectric sensor per se that has been placed within the exposure region. As a result, the output to be obtained by the photoelectric sensor is influenced by a drift due to this temperature increase. In particular, in the case of a reduction projection type exposure apparatus, since the photoelectric sensor which is designed to measure the uniformity of illuminance (or illuminance irregularity) at the surface of substrate is inevitably exposed to an intense exposure light, the photoelectric sensor is suffered from a large quantity of heat. Therefore, in the conventional method where the photoelectric sensor is moved while stopping at every measurement position within the exposure region thereby to intermittently measure the illuminance of measurement positions, the illumination heat is gradually accumulated in the photoelectric sensor with time, thereby inviting a tendency that the later the time of measurement is, the larger the degree of increase in output (measured value) over the actual illuminance due to a drift. As a result, there is a problem that the measured value is caused to include an illuminance irregularity which is not inherently originated from an optical illumination system and a projection type optical system.

BRIEF SUMMARY OF THE INVENTION

Therefore, an object of the present invention is to provide an illuminance distribution measuring method which is capable of minimizing an influence of drift in temperature to a photoelectric sensor.

Namely, this invention provides a method of measuring an illuminance distribution on a surface of a substrate to be exposed while being mounted on a substrate stage;

which is characterized in that said method comprises a step of reciprocatively moving said substrate stage in such a manner that a detecting sensor positioned on said substrate stage is moved forward along a route during which said detecting sensor is intermittently stopped at a plurality of locations within an exposure region of the surface of said substrate, and, after reaching a turning location among said plurality of locations, moved to return along said route during which said detecting sensor is intermittently stopped again at said plurality of locations within said exposure region;

in that measurement of illuminance is performed an even number of times at each of said plurality of locations except said turning location; and in that said illuminance distribution in said exposure region of the surface of said substrate is determined based not only on a measured value of illuminance obtained at each of said plurality of locations during the forward movement of said detecting sensor but also on a measured value of illuminance obtained at each of said plurality of locations during the returning movement of said detecting sensor.

The aforementioned step of reciprocatively moving said substrate stage may be performed at least twice. Further, the measurement of illuminance should preferably be performed after preheating the detecting sensor.

This invention further provides an exposing method for forming a pattern on a substrate by irradiating a luminous flux from an optical illumination system onto said substrate through a pattern of mask, while said substrate is being positioned on a substrate stage;

which is characterized in that said method comprises a step of reciprocatively moving said substrate stage in such a manner that a detecting sensor positioned on said substrate stage is moved forward along a route during which said detecting sensor is intermittently stopped at a plurality of locations within an exposure region of the surface of said substrate, and, after reaching a turning location among said plurality of locations, moved to return along said route during which said detecting sensor is intermittently stopped again at said plurality of locations within said exposure region;

in that measurement of illuminance is performed an even number of times at each of said plurality of locations except said turning location;

in that said illuminance distribution in said exposure region of the surface of said substrate is determined based not only on a measured value of illuminance obtained at each of said plurality of locations during the forward movement of said detecting sensor but also on a measured value of illuminance obtained at each of said plurality of locations during the returning movement of said detecting sensor; and in that a light volume of said luminous flux from said optical illumination system is determined based on said illuminance distribution thus determined.

This invention further provides a method for performing an exposure of a substrate by irradiating a illumination beam onto said substrate through a mask, said method comprising;

a first step of detecting an intensity of illumination beam at a plurality of locations within an irradiation region of said illumination beam in a predetermined order; and a second step of detecting an intensity of illumination beam at said plurality of locations in an order which is reverse to said predetermined order.

In this case, the location wherein the intensity of illumination beam is detected at last in said first step may be different from the location wherein the intensity of illumination beam is detected at first in said second step, and the number of repeating the detection at each of said plurality of locations except the turning location among said plurality of locations may be larger than that of said turning location.

Further, the location wherein the intensity of illumination beam is detected at last in said first step may be the same with the location wherein the intensity of illumination beam is detected at first in said second step, and the number of repeating the detection at each of said plurality of locations may be the same with each other. In this case, the number of repeating the detection at each of said plurality of locations in the first step and the second step may be at least twice, or an even number of times.

An average intensity of illumination beam at each of said plurality of locations and an average intensity of illumination beam within said irradiation region may be determined based on the intensity of illumination beam measured in said first step and in said second step. The intensity of illumination beam over the surface of said substrate may be adjusted based on the aforementioned average intensity prior to the exposure of said substrate. Further, in order to perform a scanning exposure of said substrate by making use of a illumination beam, at least one of conditions including the intensity of illumination beam over said substrate, the scanning speed of said substrate, and the width of irradiation region in the scanning direction of said substrate may be adjusted based on information concerning the sensitivity of said substrate. The light source for generating said illumination beam may be controlled based on the aforementioned average intensity of illumination beam during the scanning exposure. The distribution of luminous intensity within the irradiation region may be determined based on the luminous intensity detected in said first step and in said second step.

The method of manufacturing the apparatus according to this invention is featured in that it includes a step of transcribing the pattern of device on a work piece by making use of the aforementioned exposing method.

DETAILED DESCRIPTION OF THE INVENTION

This invention will be further explained with reference to the drawings depicting preferred embodiments of this invention.

Figure 1:
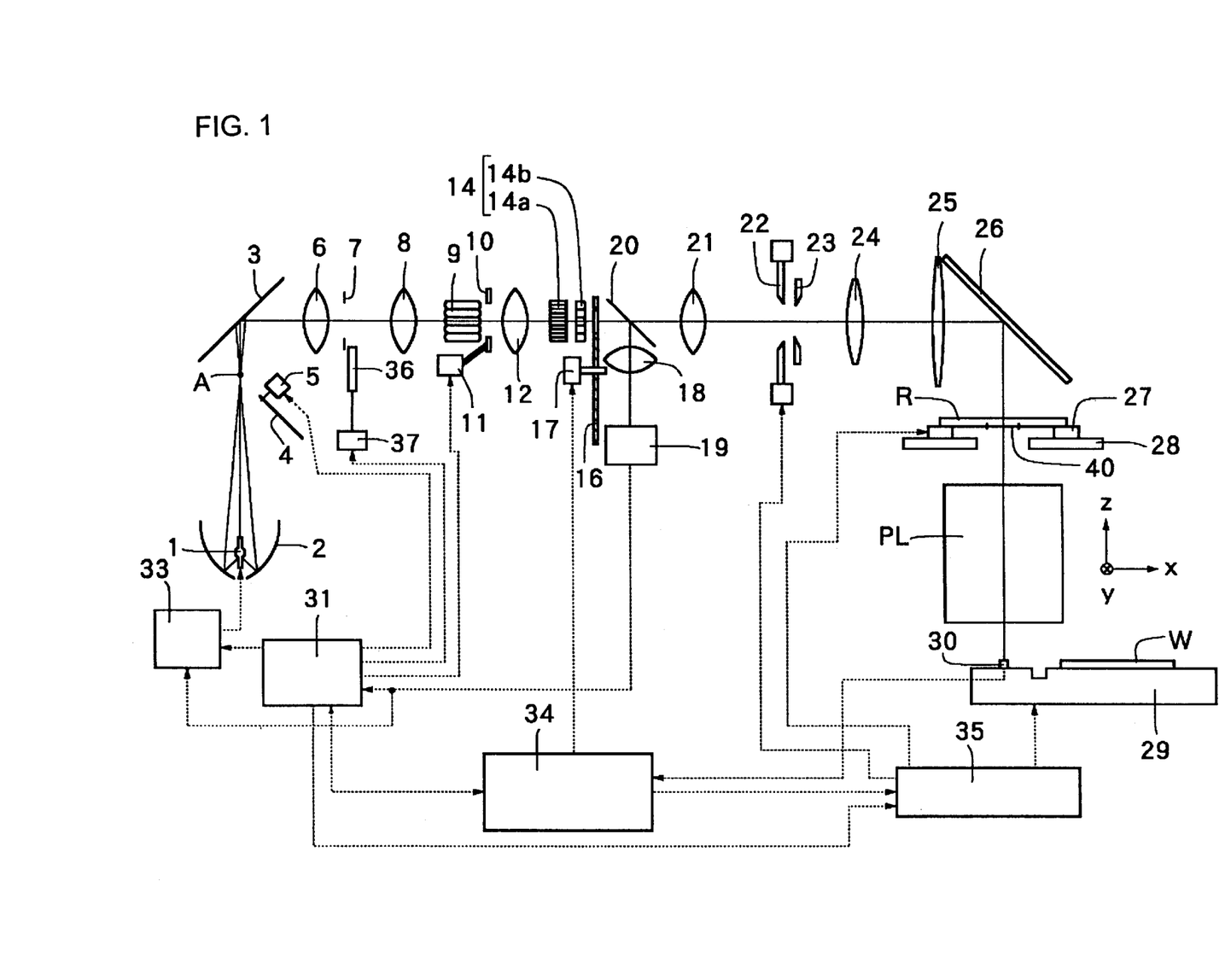
FIG. 1 is a diagram schematically illustrating the structure of a projection type exposure apparatus to which a luminance distribution measuring method according to one embodiment of this invention can be applied.

FIG. 1 shows a diagram schematically illustrating the structure of a scanning projection exposure apparatus to which a luminance distribution measuring method according to one embodiment of this invention can be applied. Referring to FIG. 1, an illuminanous beam (i-ray) from a mercury lamp 1 is converged at a convergence point A by means of an elliptical mirror 2. A shutter 4 to be actuated by a shutter control mechanism 5 is disposed in the vicinity of this convergence point A. When the shutter 4 is in an open state, the illumination beam is reflected by the mirror 3 and, after being converted into a parallel luminous flux by means of an input lens 6, reaches a field diaphragm 7. A beam attenuating plate 36 is withdrawably disposed immediately behind the field diaphragm 7 so as to enable the light volume of illumination beam passing through the field diaphragm 7 to be altered stepwise or continuously within a predetermined range.

This beam attenuating plate 36 is provided with a plurality of half-mirrors thereby enabling to select any suitable one out of these mirrors. The inclination of each half-mirror in relative to the optical axis is set such that the transmittance of these half-mirrors as a whole becomes a predetermined value. It is possible in this case to employ a turret plate provided with a plurality of ND filters each different in transmittance from each other in place of the beam attenuating plate 36. The light volume of the illumination beam can be adjusted stepwise by moving stepwise the beam attenuating plate 36 by means of a beam attenuating plate-driving mechanism 37 provided with a drive motor. According to this embodiment, an exposure control system 31 for controlling the exposure value to the substrate W, this exposure control system 31 is designed to control the movement of the beam attenuating plate-driving mechanism 37 as well as the movement of the shutter control mechanism 5. Further, the exposure control system 31 is designed to control the electric power to be supplied to the mercury lamp 1 through a power source 33, thus making it possible to adjust the intensity (light volume) of the illumination beam to be emitted from the mercury lamp 1.

After being passed through the field diaphragm 7, the illumination beam that has been adjusted of its light volume by the beam attenuating plate 36 is permitted to enter via a first relay lens 8 into a first fly eye lens 9 of a two-stage fly eye lens group. The illumination beam being emitted from a plurality of luminous source images formed by the first fly eye lens 9 is introduced via the second relay lens 12 into the second fly eye lens 14. According to this embodiment, a exposure diaphragm 10 is disposed in the vicinity of the exit plane or the light image-forming surface of the first fly eye lens 9, and the magnitude of opening of the exposure diaphragm 10 is permitted to be optionally adjusted by means of a exposure diaphragm-driving mechanism 11. The operation of the exposure diaphragm-driving mechanism 11 is also controlled by means of the exposure control system 31. It is designed according to this embodiment that the light volume of illumination beam directed toward the second fly eye lens 14 from the first fly eye lens 9 is sequentially adjusted by adjusting the magnitude of the opening of the exposure diaphragm 10.

Figure 2:
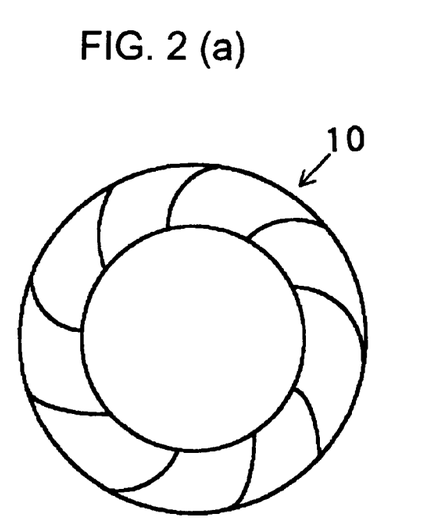
FIG. 2 is a plan view illustrating one example of diaphragm.

FIG. 2(a) illustrates one example of the exposure diaphragm 10 which is constituted by an iris diaphragm. It is designed in this case that, as shown in FIG. 2(b), the magnitude of the circular opening of the iris diaphragm can be sequentially adjusted for instance by moving a lever disposed near the iris diaphragm.

The second fly eye lens 14 according to this embodiment is constituted by a pair of bundled lens 14a and 14b, each constituted by a plurality of lens elements which are arranged forming a mosaic and having a flat surface on its one side, this pair of bundled lens 14a and 14b being arranged close to each other with their flat surfaces facing to each other. The refractive index of each lens element is selected such that the parallel luminous flux to be emitted from the light source and passed through the first bundled lens 14a are converged at the exit plane of the second bundled lens 14b, while the parallel luminous flux entering into the second bundled lens 14b from the reticle R side are converged at the incident surface of the first bundled lens 14a. Namely, it is designed that the focal plane of the second fly eye lens 14 is constituted by the exit plane of the second bundled lens 14b, so that a large number of light source images can be formed at this exit plane of the second bundled lens 14b. Therefore, this pair of bundled lens 14a and 14b can be functioned as a single fly eye lens only when they are combined in this manner.

Figure 3:
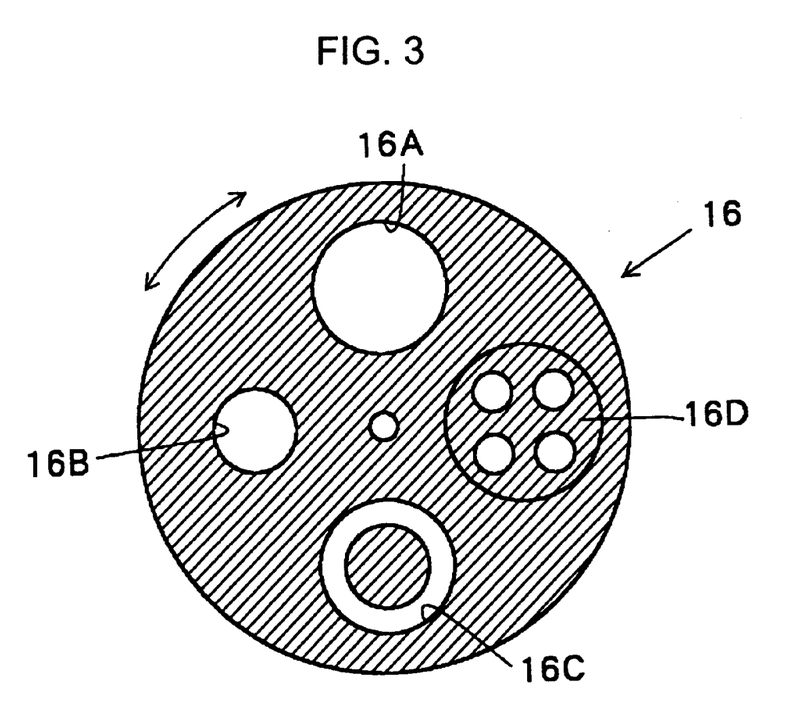
FIG. 3 is a plan view showing a plurality of illumination diaphragms to be arranged on an illumination diaphragm plate.

An illumination diaphragm plate 16 provided with plural kinds of illumination diaphragms is disposed in the vicinity of the exit plane of the second fly eye lens 14. FIG. 3 shows one example of the illumination diaphragm plate 16. Referring to FIG. 3, the illumination diaphragm plate 16 is provided therein with an aperture diaphragm 16A constituted by an ordinary circular opening; with an aperture diaphragm 16B which is constituted by a small circular opening and designed to minimize the σ value representing a coherence factor; with an aperture diaphragm 16C constituted by an annular opening for forming an annular illumination; and with an aperture diaphragm 16D constituted by a plurality of openings which are eccentrically positioned so as to be employed in a varied light source method, these aperture diaphragms 16a to 16D being equiangularly spaced apart from each other. This illumination diaphragm plate 16 is designed to be rotated about its center so as to enable a desired aperture diaphragm to be selected out of these four aperture diaphragms. The angle of rotation of the illumination diaphragm plate 16 is controlled by means of a main control system 34 through an illumination diaphragm-driving mechanism 17 provided with a drive motor.

After being passed through the second fly eye lens 14, the illumination beam is allowed to pass through an aperture diaphragm selected out of the aforementioned four aperture diaphragms formed in the illumination diaphragm plate 16 and to enter into a beam splitter 20 having a transmittance of about 98%. The luminous flux reflected by this beam splitter 20 is then converged through a condenser lens 18 at the light receptive plane of an integrator sensor 19 provided with a photoelectric detector. The light receptive plane of an integrator sensor 19 is disposed approximately in conjugation with the pattern-forming plane of the reticle R and with the exposure plane of the substrate W so as to monitor the quantity of exposure on the exposure plane of the substrate W.

On the other hand, the illumination beam passed through the beam splitter 20 is transmitted via a third lens 21 to an adjustable blind (adjustable field diaphragm) 22 provided with a couple of movable blades. The surface of this adjustable blind 22 thus disposed constitutes a Fourier transform plane of the exit plane of the second fly eye lens 14. Namely, the surface of this adjustable blind 22 is conjugated with the pattern-forming plane of the reticle R, and a fixed blind (fixed field diaphragm) 23 having a fixed opening configuration is disposed in the vicinity of the adjustable blind 22.

The fixed blind 23 is constituted by a mechanical field diaphragm wherein a rectangular opening is encircled by four knife edges for instance. The shape of a slit-like illumination region 40 over the reticle R is to be defined by the opening of this rectangular opening. Namely, an illumination beam limited by the adjustable blind 22 and the fixed blind 23 is irradiated via a fourth relay lens 24, a condenser lens 25 and a mirror 26 onto an illumination region 40.

The image of a pattern in this illumination region 40 over the reticle R is projected onto the slit-like exposure region over the substrate W at a projection magnification β (β may be ¼ or ⅕ for instance). In this case, a line which is parallel with the optical axis of the projection type optical system PL is assumed as being a z-axis, a line which is perpendicular to the z-axis and parallel with the scanning direction of the reticle R and the substrate W at the occasion of scanning exposure is assumed as being an x-axis, and a line which is perpendicular to the x-axis in the plane perpendicular to the z-axis (non-scanning direction) is assumed as being a y-axis.

According to this embodiment, the reticle R is mounted on a reticle base 28 via a scanning stage 27 which is enabled to move in the direction of the x-axis. Further, the substrate W is mounted on a substrate stage 29 which is capable of moving the substrate W in the direction of the x-axis and also capable of positioning the substrate W in relative to the y-axis. This substrate stage 29 is also provided with a Z stage which is capable of positioning the substrate W in relative to the z-axis.

A stage-driving mechanism is constituted by the scanning stage 27 and the substrate stage 29, and the movement of the stage-driving mechanism is controlled by a stage controlling system 35. At the occasion of scanning exposure, the stage controlling system 35 is operated such that the reticle R is moved by means of the scanning stage 27 at a predetermined velocity VR in the +x direction (or −x direction), and, in synchronous with this movement of the reticle R, the substrate W is also moved by means of the substrate stage 29 at a velocity VW (=β·VR) in the −x direction (or +x direction). By doing so, the pattern of the reticle R is sequentially transcribed onto the surface of the substrate W.

As shown in FIG. 1, an illuminance irregularity sensor 30 provided with a photoelectric sensor and having a light receptive surface is disposed in the vicinity of the substrate W mounted on the substrate stage 29 and in such a manner that the light receptive plane of the illuminance irregularity sensor 30 is set to the same level as that of the exposure plane of the substrate W. This illuminance irregularity sensor 30 is designed to receive part of the illumination beam through a pinhole-like transmission portion so as to measure the illuminance at plural points within the exposure region and to detect any irregularity of the illuminance. At the occasion of this measurement, the substrate stage 29 is actuated so as to move the pinhole portion of the illuminance irregularity sensor 30 thereby positioning the pinhole portion inside the exposure region, and then the substrate stage 29 is intermittently moved thereby allowing the pinhole portion to be stopped at plural locations within the exposure region so as to measure the illuminance of each of the aforementioned plural locations. Then, the illuminance irregularity (illuminance distribution) within the exposure region is calculated based on these values of illuminance measured at these plural locations.

Figure 4:
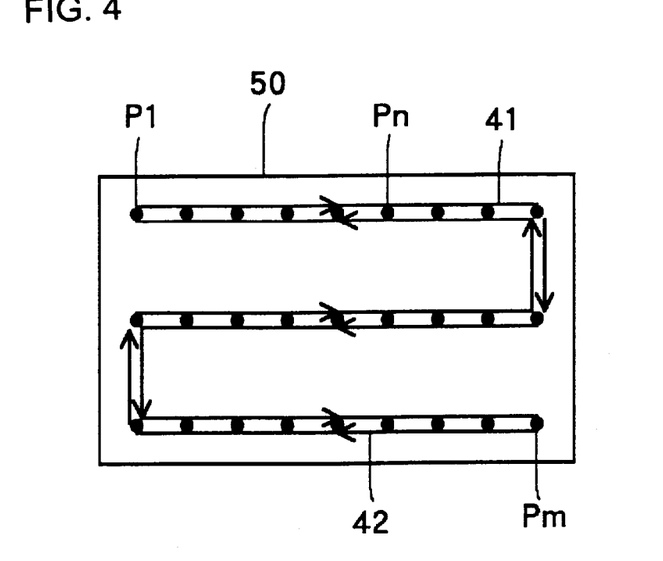
FIG. 4 is a plan view illustrating the order of the movement (reciprocative movement) of a sensor at the occasion of measuring an illuminance irregularity according to this invention.

In the projection exposure apparatus according to this embodiment, as shown in FIG. 4, the illuminance irregularity sensor 30 is reciprocatively moved along a plurality of points Pn (n=1–m) within the exposure region 50 in such a manner that at first, the illuminance irregularity sensor 30 is intermittently moved along a forward rout 41 starting from a first terminal point P1 up to a second terminal point Pm, and then intermittently moved along a return route 42 starting from the second terminal point Pm to the first terminal point P1, during which the illuminance of each of the point Pn is measured an even number of times thereby investigating any illuminance irregularity.

Figure 9:
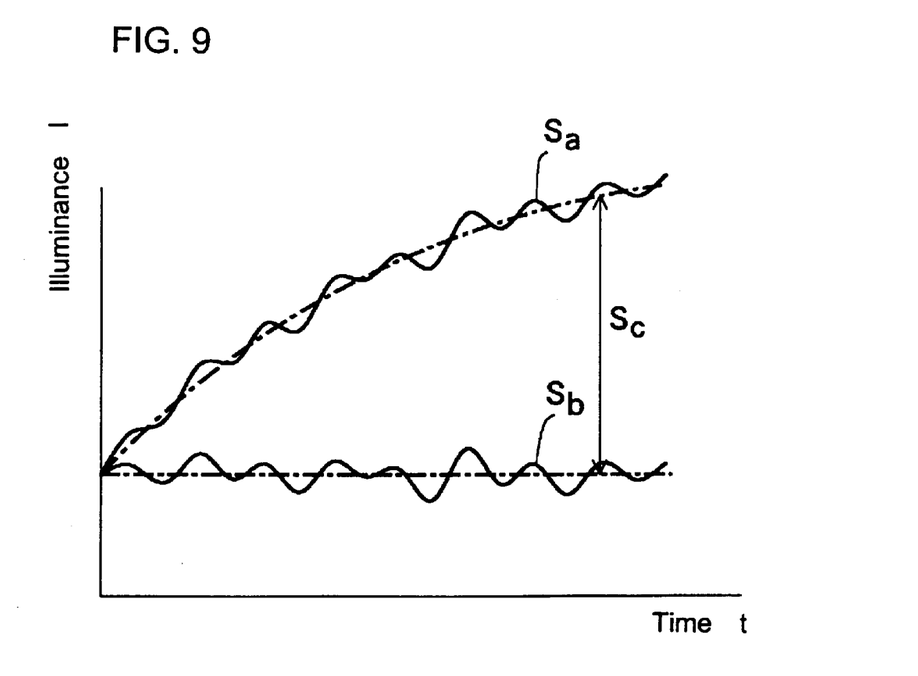
FIG. 9 is a graph illustrating a time series signal of illuminance irregularity.

Generally speaking, when the illuminance over the substrate W is increased for the purpose of enhancing the throughput, the energy to be irradiated onto the illuminance irregularity sensor 30 increases proportionately, and hence is accumulated as a thermal energy in the illuminance irregularity sensor 30. As a result, the output signal to be transmitted from the illuminance irregularity sensor 30 is drifted due to an increase in temperature of the illuminance irregularity sensor 30. FIG. 9 illustrates this phenomenon expressed as a time series signal. As shown in FIG. 9, since the output signal Sa to be detected by the illuminance irregularity sensor 30 includes therein a drift component Sc in addition to the value of illuminance Sb representing a true illuminance, it is very difficult to distinguish it from the true illuminance irregularity. In FIG. 9, the abscissa indicates the time as measured from the start of measurement, and the undulated portions of the output signal correspond to the illuminance irregularity. Further, an average value of the output signals Sa and of the illuminance values is respectively indicated by a dot and dash line.

Figure 5:
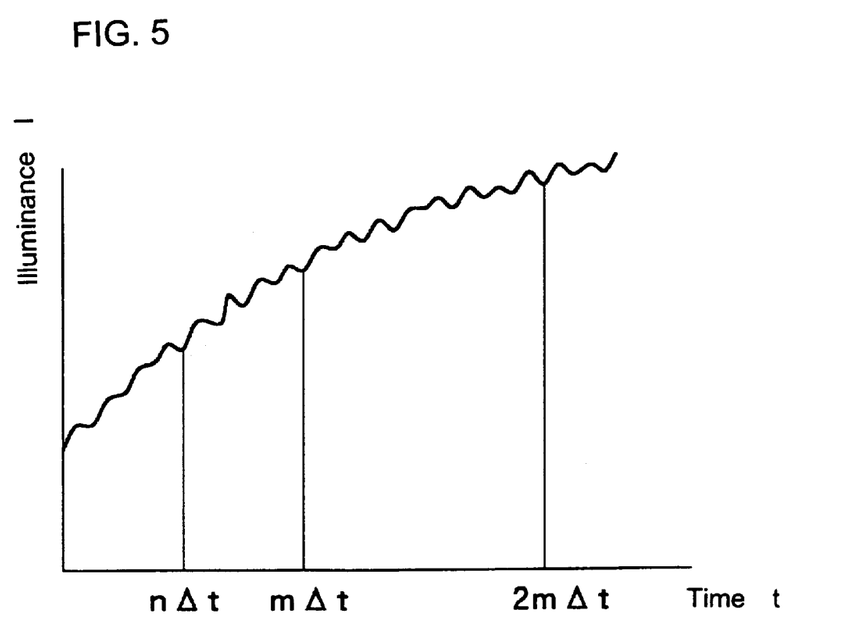
FIG. 5 is a graph illustrating a time series signal of illuminance irregularity which was obtained in the reciprocative movement, in a specific manner, of the sensor according to this invention.

By contrast, according to the illuminance distribution measuring method of this invention, in addition to the measurement of illuminance of each of plural points in the exposure region while the illuminance irregularity sensor is intermittently moved along a forward rout, the measurement of illuminance of each of plural points in the exposure region is repeatedly performed in a return rout wherein the order of measuring these plural points is reversed. Therefore, the illuminance of each of the aforementioned plural points is measured twice during this reciprocative movement of the sensor. FIG. 5 illustrates a time series signal of illuminance irregularity that was obtained by moving the reciprocation of the sensor as mentioned above. FIG. 5 shows changes in illuminance as the illuminance was measured at plural points "m" within the exposure region. Namely, during the forward rout, the measurement was performed at a plurality of points starting from the first terminal point P1 and ending at the second terminal point Pm, and during the return route, the measurement was repeatedly performed at a plurality of points in the reverse order, i.e. starting from the second terminal point Pm and ending at the first terminal point P1, thereby investigating any illuminance irregularity. In this case, the illuminance of the second terminal point Pm representing the turning point was continuously measured twice.

In FIG. 5, the abscissa indicates the time "t" as measured from the start of measurement, the ordinate represents the illuminance. The time required for the illuminance irregularity sensor 30 to move from one measuring point to the next measuring point is defined as $\Delta t$, and hence the measurement time at the "n"th point is expressed as $n\Delta t$.

The illuminance data $I_n$ obtained in the forward rout and the illuminance data $I_{2m-n+1}$ obtained in the return rout which were measured at the same point was averaged, the averaged data being assumed as an illuminance data. For example, when the illuminance irregularity at m points within the exposure region is to be measured, the average illuminance data $I_n'$ representing an average of the illuminance data of the forward rout and the illuminance data of the return rout which were obtained at the same "n"th (n=1–m) point can be expressed by the following formula (1):

$$I_n'=(I_n+I_{2m-n+1})/2 \tag{1}$$

By the way, this example illustrates a case where the illuminance of the second terminal point Pm representing the turning point is continuously measured twice. However, when the illuminance is to be measured only once at the turning point Pm, the average illuminance data $I_n'$ of each point except the turning point Pm can be expressed by the following formula (1'), and the average illuminance data $I_n'$ of the turning point Pm can be expressed by $I_n'=I_m$:

$$I_n'=(I_n+I_{2m-n})/2 \tag{1'}$$

Figure 6:
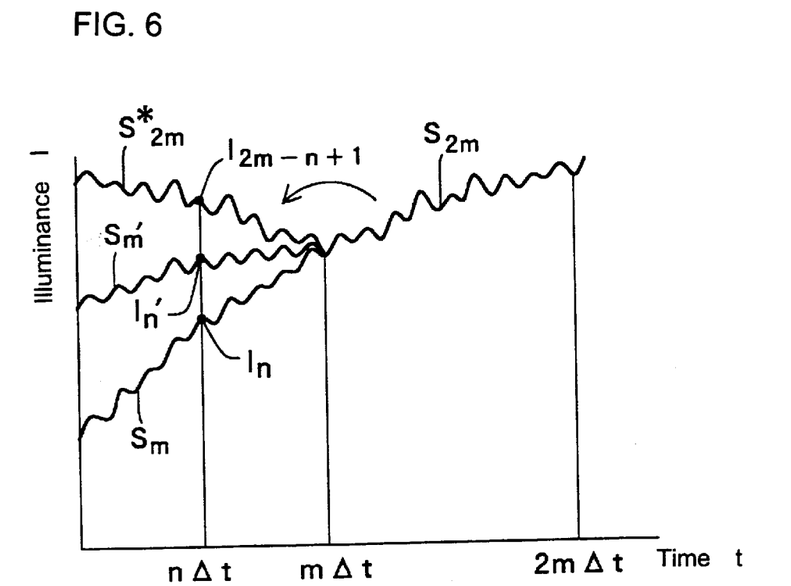
FIG. 6 is a graph illustrating a reduction of drift in the time series signal of illuminance irregularity.

FIG. 6 illustrates this average illuminance data $I_n'$. Namely, in FIG. 6 showing a curve $S_m$ representing the measured data of the forward rout starting from the first terminal point P1 and ending at the second terminal point Pm, and also a curve $S_{2m}$ representing the measured data of the return rout starting from the second terminal point Pm and ending at the first terminal point P1, there is also shown a curve $S_m'$ representing an average value between the curve $S_m$ representing the forward rout and a curve $S^*_{2m}$ which is obtained by symmetrically inverting the curve $S_{2m}$ representing the return rout with respect to the turning point Pm. Accordingly, the aforementioned average illuminance data $I_n'$ at each measuring point Pn can be represented by this curve $S_m'$. The linear component of the temperature-induced drift of the illuminance irregularity sensor 30 can be corrected through the calculation of the aforementioned average illuminance data $I_n'$ as explained below.

Since the temperature-induced drift of the illuminance irregularity sensor 30 is caused by the heating as mentioned above, it can be expressed generally as a total of exponential function according to an equation of heat conduction. For the purpose of simplification, it is assumed that the shutter 4 is kept open during the measurement of the illuminance irregularity, and that the thermal time constant is only one. As a result, the temperature $\Theta$ can be represented by the following equation (2):

$$\Theta=C(1-\exp(-t/T)) \tag{2}$$

wherein T is a thermal time constant with respect to the sensor and the peripheral hardware; and C is a temperature conversion factor.

Since the measured value of illuminance I is proportional to the temperature Θ, if the time required for the illuminance irregularity sensor 30 to move from the beginning of measurement to the "n"th measuring point Pn is defined as $t_n$, the value $I_n$ measured of illuminance after a lapse of time $t_n$ can be expressed by the following equation (3).

$$I_n = D(1 - \exp(-t_n/T)) \quad (3)$$

wherein D is a proportional constant.

When the aforementioned equation (3) is introduced into the aforementioned equation (1), the average illuminance data $I_n{'}$ at the point Pn can be represented by the following equation (4):

$$I_n' = D\left(\left(1 - \exp\left(-\frac{t_n}{T}\right)\right) + \left(1 - \exp\left(-\frac{t_{2m-n+1}}{T}\right)\right)\right)/2 \quad (4)$$

Since the exponential function herein can be approximated as follows, $$\exp(x) = 1 + \frac{x}{1!} + \frac{x^2}{2!} + \frac{x^3}{3!} + \ldots$$

the following equation (5) can be obtained.

$$1 - \exp\left(-\frac{t}{T}\right) = \frac{t}{T \cdot 1!} - \frac{t^2}{T^2 \cdot 2!} + \frac{t^3}{T^3 \cdot 3!} - \ldots \quad (5)$$

Therefore, the average illuminance data $I_n{'}$ can be expressed by the following equation (6):

$$I_n' = D\left(\left(\frac{t_n}{T \cdot 1!} - \frac{t_n^2}{T^2 \cdot 2!} + \frac{t_n^3}{T^3 \cdot 3!} - \ldots\right) + \left(\frac{t_{2m-n+1}}{T \cdot 1!} - \frac{t_{2m-n+1}^2}{T^2 \cdot 2!} + \frac{t_{2m-n+1}^3}{T^3 \cdot 3!} - \ldots\right)\right)/2 \quad (6)$$

If the time Δt required for the illuminance irregularity sensor 30 to move from one measuring point to the next measuring point during the measurement of illuminance irregularity is assumed as being the same, the time $t_n$ can be expressed by the following equation (7):

$$T_n = \Delta t \cdot n \quad (7)$$

Accordingly, when this equation (7) is introduced into the aforementioned equation (6), the average illuminance data $I_n{'}$ can be represented by the following equation (8):

$$I_n' = D\left(\left(\frac{\Delta t \cdot n}{T \cdot 1!} - \frac{(\Delta t \cdot n)^2}{T^2 \cdot 2!} + \frac{(\Delta t \cdot n)^3}{T^3 \cdot 3!} - \ldots\right) + \left(\frac{\Delta t \cdot (2m - n + 1)}{T \cdot 1!} - \frac{(\Delta t \cdot (2m - n + 1))^2}{T^2 \cdot 2!} + \frac{(\Delta t \cdot (2m - n + 1))^3}{T^3 \cdot 3!} - \ldots\right)\right)/2 \quad (8)$$

Therefore, the following equation (9) can be obtained from the above equation (8).

$$I_n' = D\left(\left(\frac{\Delta t \cdot (2m + 1)}{T \cdot 1!} - \frac{(\Delta t)^2 \cdot (n^2 + (2m - n + 1)^2)}{T^2 \cdot 2!} + \frac{(\Delta t)^3 \cdot (n^3 + (2m - n + 1)^3)}{T^3 - 3!} - \ldots\right)\right)/2 \quad (9)$$

Namely, the first term, i.e. the linear component (Δt·n) of the temperature-induced drift can be offset. By the way, although the thermal time constant T generally exists more than one in number, each thermal time constant can be mathematically factorized, thus rendering each thermal time constant to become the same as described above thereby making it possible to offset the linear component of the temperature-induced drift likewise.

Accordingly, although there may be remained more or less an influence of the non-linear component, the influence of the linear component can be eliminated according to the method of measuring the illuminance distribution as set forth by this embodiment. Therefore, it is now possible to sufficiently minimize the influence of the temperature-induced drift of the illuminance irregularity sensor 30 as compared with the illuminance irregularity.

Furthermore, although it may depend upon the construction of the sensor or the peripheral hardware, the illuminance measuring time is one or two minutes even if the aforementioned reciprocative movement is performed in contrast to the thermal time constant T which is generally 10 minutes or so. Accordingly, it can be expressed by the following equation:

$$\frac{\Delta t \cdot n}{T} \ll \frac{\Delta t \cdot 2m}{T} \ll 1$$

Namely, the influence of higher terms higher than the secondary term (the non-linear component of the output drift) can be said to be very small. Therefore, by offsetting the linear component of the temperature-induced drift by making use of the illuminance-measuring method of this invention, the influence by the drift of the photoelectric sensor can be extremely minimized or disregarded as compared with the illuminance irregularity.

When the i-ray (wavelength: 356 nm) of mercury lamp is employed as a light source as in the case of this embodiment, since the i-ray is a continuous beam and broad in width of spectrum, the sensor is more likely to be affected by the heat as compared with an excimer laser, in particular with an excimer laser whose wavelength is narrowed in band. Therefore, the measuring method according to this invention is particularly effective in such a case. The method according to this invention is also effective in the employment of a reduction type exposure apparatus where the illuminance of the exposure light is set to a relatively high level, thus rendering the sensor to be affected by heat.

Figure 7:
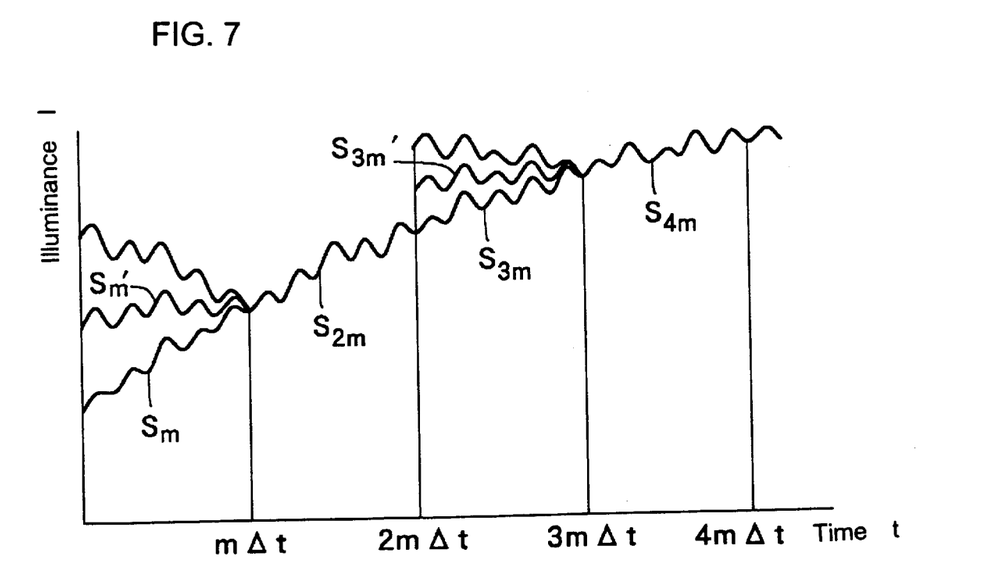
FIG. 7 is a graph illustrating the time series signal of illuminance irregularity which was obtained when the reciprocation of the sensor was repeated plural times.

According to this embodiment, an average illuminance data is obtained by a single reciprocative movement of the sensor. However, it is also possible to repeat the reciprocative movement of the sensor in the measurement of illuminance data and to calculate an average value of the illuminance data obtained by the repetition of the reciprocative movement, thereby improving the precision of measurement. For example, as shown in FIG. 7, the measurement to be obtained through the reciprocative movement may be repeated twice, and an average value may be calculated from an average illuminance data $I_n{'}$ obtained at each measuring point in the first reciprocative movement (the curve $S_m{'}$) and from an average illuminance data $I_n{''}$ obtained at each measuring point in the second reciprocative movement (the curve $S_{3m}'$). When the reciprocative movement of the sensor in the measurement of illuminance data is repeated in this manner, the effect of averaging can be improved in addition to the offset of the linear component of the temperature-induced drift, thus making it possible to further improve the measurement precision. It is also possible to apply a weight to each of the plural average illuminance data obtained and to employ the resultant weighted average value.

The illuminance and the distribution thereof over the surface of the substrate W which have been obtained in this manner are then transmitted to the exposure control system 31. Then, based on these measured values, the power to be fed to the mercury lamp 1, the movement of the beam attenuating plate-driving mechanism 37 and the opening degree of the exposure diaphragm 10 can be respectively controlled so as to suitably control the quantity of exposure to be given to the substrate W, thus making it possible to enhance the throughput under an optimum exposure condition.

Namely, according to this embodiment, since the illuminance is detected plural times at each of plural measuring points within the exposure region to be irradiated with exposure illumination beam, it is possible to obtain an average illuminance and illuminance irregularity (illuminance distribution) with high precision. Further, when the detection of illuminance is performed plural times at each of the measuring points, this plural number (the same with the number of measurement) of the detected values of illuminance (or an average value thereof) that can be obtained from the integrator sensor 19 at each measuring point are stored together with the average illuminance of each measuring point in the main control system 34. At this main control system 34, the correlation between the detected value obtained from the integrator sensor 19 and the illuminance over the surface of the substrate (for example, a conversion factor that correlates the detected value with the illuminance over the surface of the substrate) is determined based on the detected values of illuminance obtained from the integrator sensor 19 at each measuring point and the average illuminance. Namely, the calibration of the integrator sensor 19 is performed. In this manner, the control in quantity of exposure in the scanning exposure process of the substrate W can be performed with high precision by making use of the detected values obtained from the integrator sensor.

Further, even if the transmittance of the exposure monitoring system (18–20) or of the optical system (including a projection type optical system PL) to be interposed between the second fly eye lens 14 (beam splitter 20) and the surface of the substrate is altered, it is possible, through the calibration of the integrator sensor 19, to prevent the deterioration in precision of the exposure control that might be induced by this change in transmittance.

Next, the exposure control system for adjusting a cumulative exposure of illumination beam within the shot region over the substrate where the pattern of the reticle R is to be transcribed to a proper value in conformity with the sensitivity of the photoresist will be explained. Normally, the information of the sensitivity of the photoresist to be coated on the surface of the substrate W or the information on the proper exposure to the substrate W (photoresist) that can be determined depending on the aforementioned sensitivity are input to the main control system 34 by an operator. In this main control system 34, the intensity of illuminance beam over the substrate W, the width of the exposure region (an illumination beam irradiation region over the substrate) in relative to the scanning direction of the substrate W, and the scanning speed of the substrate W (and reticle R) are determined based on these information, thereby enabling the cumulative exposure of illumination beam that will be irradiated onto each point when each point of the shot region passes through the exposure region to be adjusted to an optimum exposure quantity. At the occasion of scanning exposure, the stage control system 35 is actuated so as to enable the substrate stage 29 to be moved in accordance with the determined scanning speed, and at the same time, to enable the scanning stage 28 to be moved at a velocity which is determined by multiplying the scanning speed of the substrate stage 29 by the reciprocal of the projection magnification of the projection type optical system PL. The exposure control system 31 is actuated so as to control the current for the mercury lamp 1 on the basis of the conversion factor which has been determined by the aforementioned calibration and of the detected values obtained from the integrator sensor 19. As a result, it is possible to give an optimum exposure quantity to each point within the shot region.

In view of the throughput of the exposure apparatus, it is desirable to determine the intensity of the illumination beam over the substrate and the width of the exposure region over the substrate in such a manner that the scanning speed of the substrate W can be set to the maximum speed of the substrate stage 29. Further, according to this embodiment, the shape and magnitude of the exposure region are determined by the fixed blind 23. Namely, since the width of the exposure region is fixed, the intensity of the illumination beam over the substrate is adjusted by making use of at least either one of the current control of the mercury lamp 1 and the beam attenuating plate 36. In this case, as far as the sensitivity of photoresist on the substrate W is not substantially varied even when the photoresist is changed, the intensity of the illumination beam over the substrate can be adjusted by controlling only the current of the mercury lamp 1. Whereas, if the sensitivity of the photoresist is changed substantially so that the intensity of illumination beam over the substrate is required to be changed substantially (for example, the intensity of illumination beam is required to be changed to such an extent that exceeds over the range which is adjustable in emission intensity through the control of the current for the mercury lamp 1), the transmittance (light attenuation coefficient) of the beam attenuating plate 36 is determined on the basis of the intensity determined of illumination beam over the substrate, and the exposure control system 31 is actuated so as to arrange a half-mirror (or ND filter) corresponding to the aforementioned transmittance in the passageway of the illumination beam. The exposure control system 31 is also actuated so as to control the current for the mercury lamp 1 thereby to perform a fine adjustment of the emission intensity, thus optimizing the intensity of the illumination beam over the substrate.

Although a mercury lamp is employed as an exposure light source in this embodiment, it is also possible to employ a pulse light source such as an excimer laser. In this case, the intensity of pulse beam over the substrate W, the width of the exposure region in relative to the scanning direction of the substrate W, the scanning speed of the substrate W (and reticle R) and the oscillation frequency of the pulse source are determined based on the sensitivity of the photoresist or an optimum quantity of exposure thereof. By doing so, the cumulative exposure of pulse beam that will be irradiated onto each point within the shot region over the substrate W can be adjusted to an optimum exposure quantity.

According to this embodiment, an illuminance irregularity (illuminance distribution) in the exposure region is detected as explained above. However, if the illuminance irregularity thus detected is found exceeded over a predetermined allowable range, a filter may be employed positioning it in the vicinity of the incident plane of the first fly eye lens 9 so as to shield all or part of the incident plane of at least one of rod lenses constituting the first fly eye lens 9, thereby correcting the illuminance irregularity in the exposure region over the substrate.

By the way, the position of the filter for correcting the illuminance irregularity may not be restricted to the vicinity of the incident plane of the first fly eye lens 9, but may be in the vicinity of the incident plane of the second fly eye lens 14 for instance as long as the surface thereof is conjugated with the plane of pattern of the reticle R inside the optical illumination system.

Further, the fly eye lens (9, 14) disposed inside the optical illumination system may be replaced by a rod integrator, or by a combination of a fly eye lens and a rod integrator. In this case, the rod integrator is arranged in such a manner that the incident plane of the rod integrator coincides approximately with the Fourier transform plane of the optical illumination system and the exit plane of the rod integrator is approximately conjugated with the plane of the pattern of the reticle R in the optical illumination system. Accordingly, the fixed reticle blind 23 and the adjustable reticle blind 22 are placed close to the exit plane of the rod integrator, while the illumination diaphragm plate 16 is arranged close to the incident plane of the rod integrator or at the Fourier transform plane (pupil plane) which will be interposed between the rod integrator and the reticle R. By the way, the aforementioned filter for correcting the illuminance irregularity is positioned close to the exit plane of the rod integrator, or conjugative with the exit plane of the rod integrator (i.e. the surface of pattern of the reticle R).

Although this embodiment is directed to a case where this invention is applied to a scanning projection exposure apparatus, it is also possible to apply this invention to a batch exposure type exposure apparatus.

Since the temperature-induced drift in output of the illuminance irregularity sensor can be expressed by the exponential function as shown by the aforementioned equation (3), the rate of change in output due to the drift becomes lower as the temperature increases. Accordingly, it is possible to obtain an illuminance distribution which is more excellent in precision by initiating the measurement of illuminance after preheating the illuminance irregularity sensor by the irradiation of i-ray so as to lower the rate of output change originating from the drift.

Although a mercury lamp is employed as a light source in the aforementioned embodiment, it is also possible to prevent the thermal drift of the illuminance irregularity sensor and to perform the measurement of illuminance distribution with high precision even if an excimer laser is employed as a light source in place of the mercury lamp.

By the way, the exposure region 50 to be irradiated with an illumination beam inside the image field of the projection type optical system PL is a projection region where a reduced image of a portion of pattern is to be formed on the reticle R. Further, the projection type optical system PL is double-telecentric wherein a first plane (an object plane) is served for placing the reticle R therein, while a second plane (an image plane) is served for placing the substrate W therein. Additionally, the projection type optical system PL is provided with a circular image field. The illumination region 40 and the exposure region 50, each being located inside the image field the projection type optical system PL with the center of them being positioned to agree with the optical axis of the projection type optical system PL, are respectively formed of a rectangular region which is elongated in the non-scanning direction (y-direction) orthogonally intersecting with the scanning direction (x-direction) of the reticle R as well as of the substrate W. The shape of these illumination region 40 and exposure region 50 may be rhombic, semicircular or trapezoidal other than rectangular.

The projection type optical system PL is not limited to a refraction system consisting only of plural refractive optical elements, but may be a reflective refraction system comprising a refractive optical element and a reflective optical element, or a reflection system consisting only of plural reflective optical elements. Examples of reflective refraction system include an optical system provided at least with a beam splitter and a concave mirror as a reflective optical element; an optical system provided with a concave mirror and a mirror as a reflective optical element but not provided with a beam splitter; and an optical system provided with plural refractive optical elements and a couple of reflective optical elements (at least one of them is a concave mirror), these elements being arranged along the same optical axis, as set forth in U.S. Pat. No. 5,031,976; No. 5,788,229; and No. 5,717,518. It is also possible to apply this invention to an exposure apparatus of proximity system for instance where a projection type optical system is not employed.

In the foregoing embodiments, a modified illumination or a change of σ-value is performed by making use of the illumination diaphragm plate 16. However, it is also possible to change the intensity distribution of the illumination beam on the incident plane of the first fly eye lens 9 by movably disposing at least one of the optical elements being arranged between the mercury lamp 1 and the first fly eye lens 9. Further, a pair of conical prisms may be additionally mounted more close to the mercury lamp 1 than at least one of the optical elements, the interval between this pair of conical prisms being made adjustable in the direction of the optical axis. In this case, the illumination beam to be irradiated onto the incident plane of the first fly eye lens 9 can be adjusted in such a manner that the intensity distribution thereof becomes higher at the annular peripheral region thereof than the center thereof. It becomes possible with this structure to alter the intensity distribution of the illumination beam on the Fourier transform plane of the illumination optical system which is to be positioned on the focal plane on the exit side in the case of the fly eye lens, or to be positioned between the exit plane and the reticle R in case of the rod integrator. Moreover, even if the σ-value is minimized or the ordinary illumination is changed to a modified illumination (for instance, an annular illumination), any loss in light quantity of the illumination beam that may be resulted by these changes can be extremely reduced, thus making it possible to assure a high throughput.

The illumination beam for the exposure is not limited to g-ray or i-ray to be generated from the mercury lamp 1, but may be an ultraviolet ray having a wavelength of 350 nm or less such as KrF excimer laser, ArF excimer laser and $F_2$ laser; an EUV beam (XUV beam) of soft X-ray region having a wavelength of 5 to 15 nm e.g. 13.4 nm or 11.5 nm; or hard X-ray having a wavelength of about 1 nm or less. In the case of an exposure apparatus where EUV beam or X-ray is to be employed, the illuminance irregularity sensor 30 may be constructed such that a pin-hole is formed by removing a portion of a reflective layer formed on the surface of a fluorescence-emitting material deposited on a glass plate, and at the same time, a photoelectric transferring element such as photomultiplier is attached to a lower portion of the glass plate. When EUV beam for instance is irradiated onto this fluorescence-emitting material in this case, a light having a longer wavelength than that of the EUV beam is generated and then detected by the photoelectric transferring element. The illuminance of the illuminating beam (EUV beam, etc.) on the surface of the substrate can be determined from the intensity of the electric signal to be transmitted from this photoelectric transferring element.

Instead of using an ultra-high pressure mercury lamp, an excimer laser or $F_2$ laser, it is also possible to employ single wavelength laser of the infrared zone or of the visible zone that can be oscillated from DFB semiconductor laser or fiber laser, wherein this single wavelength laser is amplified at first by a fiber amplifier doped with erbium (or both erbium and ytterbium) and then converted into harmonics by making use of a non-linear optical crystal, thus enabling it to be used as an ultraviolet ray.

For example, if the oscillated wavelength of a single wavelength laser is selected to be in the range of from 1.51 to 1.59 μm, an 8-fold harmonics having an emitted wavelength ranging from 189 to 199 nm, or a 10-fold harmonics having an emitted wavelength ranging from 151 to 159 nm can be obtained as an output. In particular, if the oscillated wavelength is selected to be in the range of from 1.544 to 1.553 μm, an 8-fold harmonics having a wavelength ranging from 193 to 194 nm, i.e. an ultraviolet ray having the same wavelength as that of ArF excimer laser can be obtained as an output. Further, if the oscillated wavelength is selected to be in the range of from 1.57 to 1.58 μm, a 10-fold harmonics having a wavelength ranging from 157 to 158 nm, i.e. an ultraviolet ray having approximately the same wavelength as that of $F_2$ laser can be obtained as an output.

Furthermore, if the oscillated wavelength is selected to be in the range of from 1.03 to 1.12 μm, a 7-fold harmonics having a wavelength ranging from 147 to 160 nm can be obtained as an output. In particular, if the oscillated wavelength is selected to be in the range of from 1.099 to 1.106 μm, a 7-fold harmonics having an emitted wavelength ranging from 157 to 158 nm, i.e. an ultraviolet ray having approximately the same wavelength as that of $F_2$ laser can be obtained as an output. By the way, as for the single wavelength oscillation laser, an ytterbium-doped fiber laser can be employed.

This invention can be applied not only to an exposure apparatus to be employed for the manufacture of a semiconductor device, but also to an exposure apparatus to be employed for transcribing a device pattern onto a glass plate in the manufacture of a display comprising a liquid crystal display element, to an exposure apparatus to be employed for transcribing a device pattern onto a ceramic wafer in the manufacture of a thin film magnetic head, or to an exposure apparatus to be employed for the manufacture of an image pickup device (CCD, etc.).

This invention is also applicable to an exposure apparatus to be employed for transcribing a circuit pattern onto a glass substrate, a silicon wafer, etc. in the manufacture of not only a microdevice such as a semiconductor element but also a reticle or a mask to be employed in a light exposure apparatus, an EUV exposure apparatus, an X-ray exposure apparatus or an electron beam exposure apparatus. In the case of an exposure apparatus where DUV (far-ultraviolet ray) or VUV (vacuum ultraviolet ray) is employed, a transmission type reticle is generally employed. As for the reticle substrate, it is possible to employ quartz glass, fluorine-doped quartz glass, silica, magnesium fluoride or quartz crystal. In the case of an X-ray exposure apparatus of proximity system, or an electron beam exposure apparatus, a transmission type mask (such as stencil mask and membrane mask) is generally employed. As for the substrate of mask, silicon wafer, etc. can be employed.

The exposure apparatus according to the aforementioned embodiment can be manufactured by a process wherein an illumination optical system constituted by plural number of optical elements, and a projection type optical system are attached to a main body of the exposure apparatus, followed by a step of an optical adjustment of these systems; a reticle stage consisting of a large number of mechanical parts and a wafer stage are mounted on the aforementioned main body, followed by a step of connecting them with wirings and pipings; and finally a total adjustment (electrical adjustment and operation confirmation) is performed. By the way, the assembling of the exposure apparatus should preferably be conducted in a clean room where the temperature and the cleanness can be strictly controlled.

A semiconductor device can be manufactured by a process comprising the steps of designing the function and performance the device, manufacturing a reticle on the basis of the aforementioned design, manufacturing a wafer from a silicon material, exposing the wafer through the pattern of the reticle by making use of the exposure apparatus according to the aforementioned embodiment, assembling the device (including the steps of dicing, bonding, packaging, etc.), and examining the performance of the device.

As explained above, according to this invention, in addition to the measurement of illuminance irregularity during the intermittent movement of the measuring positions within the exposure region in the forward rout, the measurement of illuminance irregularity is also performed at the same location of measurement in the return rout wherein the order of measurement is reversed. Namely, since even number of measurements on the illuminance are performed at each measuring location, it is possible to correct the linear component of the temperature-induced drift of the photoelectric sensor, thus making it possible to obtain an illuminance distribution on the surface of substrate with high precision.

In particular, even when i-ray of mercury lamp of large output or an excimer laser is employed as a light source, or even when the sensor is employed in a condition where the sensor can be readily heated as in the case of using a reduction type exposure apparatus, it possible to perform the measurement of illuminance distribution while effectively suppressing an influence of drift.

It may be generally conceivable to cool the sensor at the occasion of correcting the drift in the output of a photoelectric sensor. However, since a Peltier element, etc. is required to be mounted close to the wafer stage or an interferometer optical system which are rather sensitive to temperature in a thermoelectric cooling using the Peltier element, it may invite a cause for the wobble of interferometer. On the other hand, in the case of liquid cooling or air cooling, the pipings or equipment are required, thus inviting an additional disturbance in the control of the wafer stage. By contrast, this invention is irrelevant to the aforementioned technical difficulties, and is easy in operation and advantageous in manufacturing cost.

What is claimed is:

1. A method of measuring an illuminance distribution on a surface of a substrate to be exposed while being mounted on a substrate stage;
   which is characterized in that said method comprises a step of reciprocatively moving said substrate stage in such a manner that a detecting sensor positioned on said substrate stage is moved forward along a route during which said detecting sensor is intermittently stopped at a plurality of locations within an exposure region of the surface of said substrate, and, after reaching a turning location among said plurality of locations, moved to return along said route during which said detecting sensor is intermittently stopped again at said plurality of locations within said exposure region;

in that measurement of illuminance is performed an even number of times at each of said plurality of locations except said turning location; and in that said illuminance distribution in said exposure region of the surface of said substrate is determined based not only on a measured value of illuminance obtained at each of said plurality of locations during the forward movement of said detecting sensor but also on a measured value of illuminance obtained at each of said plurality of locations during the returning movement of said detecting sensor.

2. The method according to claim 1, wherein said step of reciprocatively moving said substrate stage is performed at least twice.

3. The method according to claim 1, wherein said measurement of illuminance is performed after preheating said detecting sensor.

4. An exposing method for forming a pattern on a substrate by irradiating a luminous flux from an optical illumination system onto said substrate through a pattern of mask, while said substrate is being positioned on a substrate stage;

which is characterized in that said method comprises a step of reciprocatively moving said substrate stage in such a manner that a detecting sensor positioned on said substrate stage is moved forward along a route during which said detecting sensor is intermittently stopped at a plurality of locations within an exposure region of the surface of said substrate, and, after reaching a turning location among said plurality of locations, moved to return along said route during which said detecting sensor is intermittently stopped again at said plurality of locations within said exposure region;

in that measurement of illuminance is performed an even number of times at each of said plurality of locations except said turning location;

in that said illuminance distribution in said exposure region of the surface of said substrate is determined based not only on a measured value of illuminance obtained at each of said plurality of locations during the forward movement of said detecting sensor but also on a measured value of illuminance obtained at each of said plurality of locations during the returning movement of said detecting sensor; and in that a light volume of said luminous flux from said optical illumination system is determined based on said illuminance distribution thus determined.

5. A method for performing an exposure of a substrate by irradiating a illumination beam onto said substrate through a mask, said method comprising;

a first step of detecting an intensity of illumination beam at a plurality of locations within an irradiation region of said illumination beam in a predetermined order; and a second step of detecting an intensity of illumination beam at two or more locations of said plurality of locations in an order which is reverse to said predetermined order.

6. The method according to claim 5, wherein the location wherein the intensity of illumination beam is detected at last in said first step is different from the location wherein the intensity of illumination beam is detected at first in said second step.

7. The method according to claim 6, wherein the number of repeating the detection at each of said plurality of locations except the turning location among said plurality of locations is larger than that of said turning location.

8. The method according to claim 5, wherein the location wherein the intensity of illumination beam is detected at last in said first step is the same with the location wherein the intensity of illumination beam is detected at first in said second step, and the number of repeating the detection at each of said plurality of locations is the same with each other.

9. The method according to claim 8, wherein the number of repeating the detection at each of said plurality of locations in the first step and the second step is at least twice.

10. The method according to claim 9, wherein the number of repeating the detection is an even number.

11. The method according to claim 5, wherein an average intensity of illumination beam at each of said plurality of locations and an average intensity of illumination beam within said irradiation region is determined based on the intensity of illumination beam measured in said first step and in said second step.

12. The method according to claim 11, wherein an intensity of illumination beam over the surface of said substrate is adjusted based on the aforementioned average intensity prior to the exposure of said substrate.

13. The method according to claim 11, wherein at least one of conditions including the intensity of illumination beam over said substrate, the scanning speed of said substrate, and the width of irradiation region in the scanning direction of said substrate is adjusted based on information concerning the sensitivity of said substrate in order to perform a scanning exposure of said substrate by making use of a illumination beam.

14. The method according to claim 13, wherein said light source for generating said illumination beam is controlled based on the aforementioned average intensity of illumination beam during the scanning exposure.

15. The method according to claim 11, wherein the distribution of luminous intensity within the irradiation region is determined based on the luminous intensity detected in said first step and in said second step.

16. A method of manufacturing the device which is featured in that it includes a step of transcribing the pattern of device on a work piece by making use of the exposing method claimed in claim 5.

* * * * *